(12) United States Patent
Seethamraju et al.

(10) Patent No.: US 11,150,316 B2
(45) Date of Patent: Oct. 19, 2021

(54) HYBRID PERFUSION-INTERLEAVED DIFFUSION IMAGING

(71) Applicant: The Brigham and Women's Hospital, Boston, MA (US)

(72) Inventors: Ravi Teja Seethamraju, Malden, MA (US); Geoffrey S. Young, Boston, MA (US); Lei Qin, Natick, MA (US)

(73) Assignee: The Brigham and Women's Hospital, Inc., Boston, MA (US)

( * ) Notice: Subject to any disclaimer, the term of this patent is extended or adjusted under 35 U.S.C. 154(b) by 0 days.

(21) Appl. No.: 16/735,805

(22) Filed: Jan. 7, 2020

(65) Prior Publication Data
US 2021/0208229 A1    Jul. 8, 2021

(51) Int. Cl.
*G01R 33/563*    (2006.01)
*G01R 33/56*    (2006.01)
*G01R 33/561*    (2006.01)

(52) U.S. Cl.
CPC ... *G01R 33/56366* (2013.01); *G01R 33/5608* (2013.01); *G01R 33/5616* (2013.01); *G01R 33/56341* (2013.01)

(58) Field of Classification Search
CPC .......... G01R 33/56366; G01R 33/5616; G01R 33/56341; G01R 33/5608
See application file for complete search history.

(56) References Cited

U.S. PATENT DOCUMENTS

2017/0192074 A1*   7/2017   Seethamraju ...... G01R 33/4826

OTHER PUBLICATIONS

Ellingson, B. M. et al. "Hybrid function diffusion and perfusion maps for evaluation of gliomas", Proc. Intl. Soc. Mag. Reson. Med., (2009), (p. 1000, 1 total page).
Chen, Feng et al. "Magnetic resonance diffusion-perfusion mismatch in acute ischemic stroke: An update", World Journal of Radiology, Mar. 28, 2012, vol. 4, Issue 3, ISSN: 1949-8470, (pp. 63-74, 12 total pages).
Wu, Wen-Chau, et al. "Stimultaneous assessment of cerebral blood volume and diffusion heterogeneity using hybrid IVIM and DK MR imaging: initial experience with brain tumors", Euro Radiol, (2017), vol. 27, DOI: 10.1007/s00330-016-4272-z, (pp. 306-314, 9 total pages).

(Continued)

*Primary Examiner* — Farhana A Hoque (57) ABSTRACT

Systems and methods execution of a magnetic resonance imaging pulse sequence including a first spin-echo echo planar imaging pulse sequence to acquire first data of a volume, a second spin-echo echo planar imaging pulse sequence comprising a first one or more diffusion gradient pulses to acquire first diffusion data of the volume, a third spin-echo echo planar imaging pulse sequence comprising a second one or more diffusion gradient pulses to acquire second diffusion data of the volume, and a fourth spin-echo echo planar imaging pulse sequence comprising a third one or more diffusion gradient pulses to acquire third diffusion data of the volume, generation of perfusion metrics based on the first data, and generation of diffusion metrics based on the first data, the first diffusion data, the second diffusion data, and the third diffusion data.

20 Claims, 7 Drawing Sheets

(56) References Cited

OTHER PUBLICATIONS

Li, Xiang et al. "Effect of Intravenous Gadolinium-DTPA on Diffusion-Weighted Imaging of Brain Tumors: A Short Temporal Interval Assessment", Magnetic Resonance in Medicine, (2014), vol. 40, DOI 10.1002/jmri.24386, (pp. 616-621, 6 total pages).

Le Bihan, Denis et al. "Imaging of Diffusion and Microcirculation with Gradient Sensitization: Design, Strategy, and Significance", JMRI, 1991, vol. 1, (pp. 7-28, 22 total pages).

Butts, Kim et al. "Diffusion-Weighted Interleaved Echo-Planar Imaging with a Pair of Orthogonal Navigator Echoes", Magnetic Resonance in Medicine, (1996), vol. 35 (pp. 763-770, 8 total pages).

\* cited by examiner

HYBRID PERFUSION-INTERLEAVED DIFFUSION IMAGING

BACKGROUND

A Magnetic Resonance (MR) scanner generates images of patient anatomy based on sequences of RF pulses. Echo-planar imaging (EPI) is a type of MR imaging which provides high-speed image acquisition. Due to its high speed (e.g., acquisition of an entire image within tens of milliseconds), EPI is often used to obtain images for neuroscientific studies.

For example, EPI-based diffusion-weighted (i.e., diffusion) images and perfusion images are helpful in evaluating stroke and brain cancer. Diffusion images may be used to estimate the amount of water in a voxel which is not within a cell or a vessel (i.e., the extra-cellular volume fraction). This value may be useful in stroke analysis as indicative of an extent of ischemic cell swelling, or in tumor analysis as indicative of a degree of tumor cellularity.

Perfusion imaging may consist of EPI imaging without the use of diffusion gradients after injection of a bolus of contrast media. Tracer dilution theory may be applied to thusly-acquired data to calculate metrics such as the volume of the capillary bed, the volumetric flow rate and the transit time.

Determination of perfusion and diffusion on a voxel-by-voxel basis may improve the identification of various pathologies. For example, tumor tissue and therapy-induced-necrosis tissue may exhibit similar diffusivity but different perfusivity. In stroke analysis, knowledge of the diffusive and perfusive properties of infarcted tissue may allow discrimination between areas of irreversible damage and areas which might be saved.

Conventional systems for comparing perfusion and diffusion on a voxel-by-voxel basis are error-prone. Registration errors, even after applying corrections, result in an inherent mismatch between diffusion images and perfusion images. Moreover, acquisitions of diffusion images will involve field, signal and system distortions which differ from those present during acquisition of perfusion images, further impeding spatial and/or quantitative comparison therebetween.

The foregoing difficulties are exacerbated by the dependency of diffusion estimates on perfusive tissue properties and of perfusion estimates on diffusive tissue properties. Tracer dilution theory assumes a non-diffusible tracer, and therefore the accuracy of perfusion estimates is affected by the diffusivity of the subject tissue. Moreover, the extent of vessel water flow, which depends on perfusive properties, causes de-phasing of the spins and a resulting signal drop which alters estimated water diffusivity in the extracellular/extravascular space.

Systems are desired for efficiently acquiring diffusion images and perfusion images. Such systems may facilitate comparison of diffusion and perfusion in a given region and/or improved measurements thereof.

DETAILED DESCRIPTION

The following description is provided to enable any person in the art to make and use the described embodiments. Various modifications, however, will remain readily apparent to those in the art.

Some embodiments provide acquisition of diffusion data and perfusion data in a single pulse sequence. Embodiments may therefore facilitate registration of resulting perfusion data and diffusion data. Acquisition distortions present during acquisition of the perfusion data may be similar to acquisition distortions present during acquisition of the diffusion data, facilitating comparison between the two data sets.

According to some embodiments, one or more blocks of the pulse sequence acquire data used to generate perfusion metrics and diffusion metrics. Such embodiments may therefore reduce a total required acquisition time with respect to conventional systems.

Perfusion data and diffusion data as described herein may comprise perfusion source images and diffusion (e.g., Diffusion-Weighted Imaging) source images, for example. Perfusion metrics and diffusion metrics may comprise the above-mentioned source images, parameter or metric maps including Apparent Diffusion Coefficient maps, relative Cerebral Blood Volume maps, relative Cerebral Blood Flow maps, leakage maps, Mean Transit Time maps, Time-To-Peak maps, and non-image format data such as scalar and tensor/vector metrics (e.g., Apparent Diffusion Coefficient, Fractional Anisotropy and others derived from various diffusion post-processing models, and relative Cerebral Blood Volume, relative Cerebral Blood Flow, leakage, Mean Transit Time, Time-To-Peak and others derived from various perfusion post-processing models). Embodiments are not limited to the above examples.

Figure 1:
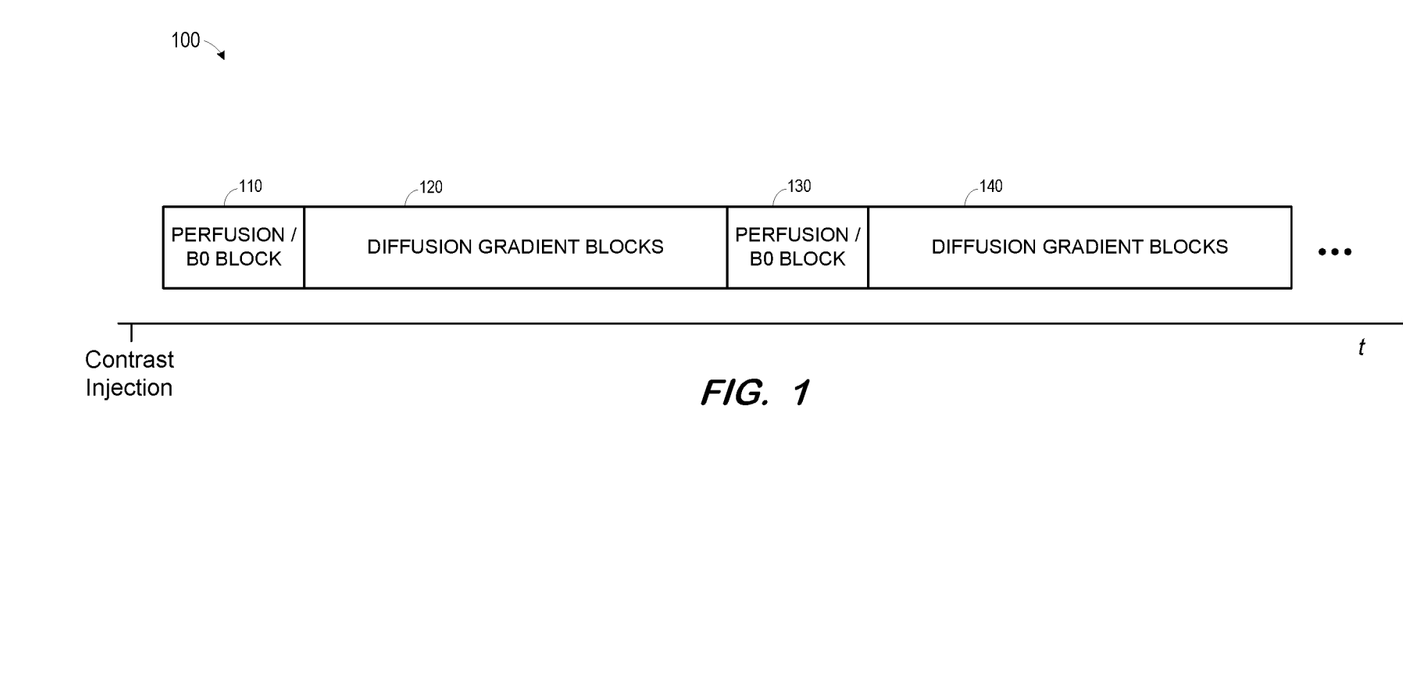
FIG. 1 illustrates a pulse sequence according to some embodiments.

FIG. 1 illustrates pulse sequence 100 with respect to time according to some embodiments. Pulse sequence 100 may comprise a spin-echo EPI (SE-EPI) sequence, but embodiments may employ any suitable sequence type.

Block 110 is executed after injection of MR contrast media into a volume to be imaged as is known in the art of perfusion imaging. The MR contrast media may be paramagnetic gadolinium based. Block 110 may comprise an SE-EPI pulse sequence block which does not include diffusion gradients. Execution of block 110 results in the acquisition of k-space data from the volume, which may be considered perfusion data.

The k-space data acquired by block 110 may also be considered B0 (or zero strength) diffusion gradient data. As is known in the art, diffusion-weighted imaging (DWI) requires acquisition of a set of k-space data using no diffusion gradients and acquisition of at least one other set of k-space data using diffusion gradients with strength greater than zero, typically signified by a B value. Each of the at least one other set of k-space data may further by acquired using diffusion gradients having one or more different directions. Embodiments are not limited to one other diffusion strength or diffusion direction.

Block 120 may represent pulse sequences for acquiring one or more other sets of k-space data. Each sequence may comprise a same SE-EPI sequence (which may be identical to the SE-EPI sequence of block 110), with the addition of acquisition-specific diffusion gradients for each sequence. Accordingly, at the termination of block 120, a k-space data set of perfusion data has been acquired (via block 110), as well as k-space data sets of B0 diffusion data (via block 110) and of diffusion data associated with one or more other diffusion gradient directions (via block 120).

In the illustrated example, block 130 is executed after block 120 and may comprise an SE-EPI pulse sequence block which does not include diffusion gradients. Block 130 may be identical to block 110 and results in the acquisition of perfusion data as described above. The perfusion data acquired by executing block 130 may differ from the perfusion data acquired by executing block 110 due at least to the passage of the contrast media through the volume in the intervening time period.

The k-space data acquired by executing block 130 may be considered another set of B0 diffusion data. Accordingly, block 140 may represent pulse sequences for acquiring three or more other sets of k-space data. Each pulse sequence of block 140 may comprise a same SE-EPI sequence as used in each other block of sequence 100, with the addition of acquisition-specific diffusion gradients for each sequence. As will be described below, the acquisition-specific diffusion gradients of each sequence of block 140 may be identical to or different from the acquisition-specific diffusion gradients of each sequence of block 120.

Accordingly, at the termination of block 120, a k-space data set of perfusion data has been acquired (via block 110), as well as k-space data sets of B0 diffusion data (via block 110) and of diffusion data associated with one or more other diffusion gradient directions (via block 120).

Pulse sequence 100 may include additional blocks, which may follow the pattern described above. At the termination of pulse sequence 100, the acquired perfusion data may be used to generate perfusion metrics as is known in the art. Additionally, the acquired diffusion data (where the acquired perfusion data also serves as acquired B0 diffusion data) may be used to generate diffusion metrics as is known in the art.

In some embodiments, block 120 includes only a single pulse sequence having a diffusion gradient with a first direction and strength, and block 140 includes only a single pulse sequence having a diffusion gradient with a second direction and strength. According to such embodiments, single perfusion pulse sequences and interleaved with single diffusion pulse sequences at least until an adequate number of different diffusion gradient directions have been employed.

Due to the foregoing, the resulting perfusion and diffusion metrics may be substantially registered with one another, facilitating analysis of any common voxels. The perfusion and diffusion metrics may exhibit similar artifacts due to similar acquisition distortions, facilitating correction thereof (if desired) while maintaining relative consistency therebetween. Moreover, the use of a single pulse sequence block to acquire perfusion data which also serves as a diffusion data may reduce total acquisition time with respect to conventional systems for acquiring perfusion data and diffusion data.

According to some embodiments, baseline perfusion/B0 data is acquired prior to contrast injection. The baseline perfusion/B0 data is used along with the data acquired after the contrast injection to generate the perfusion and diffusion metrics as described above.

Figure 2:
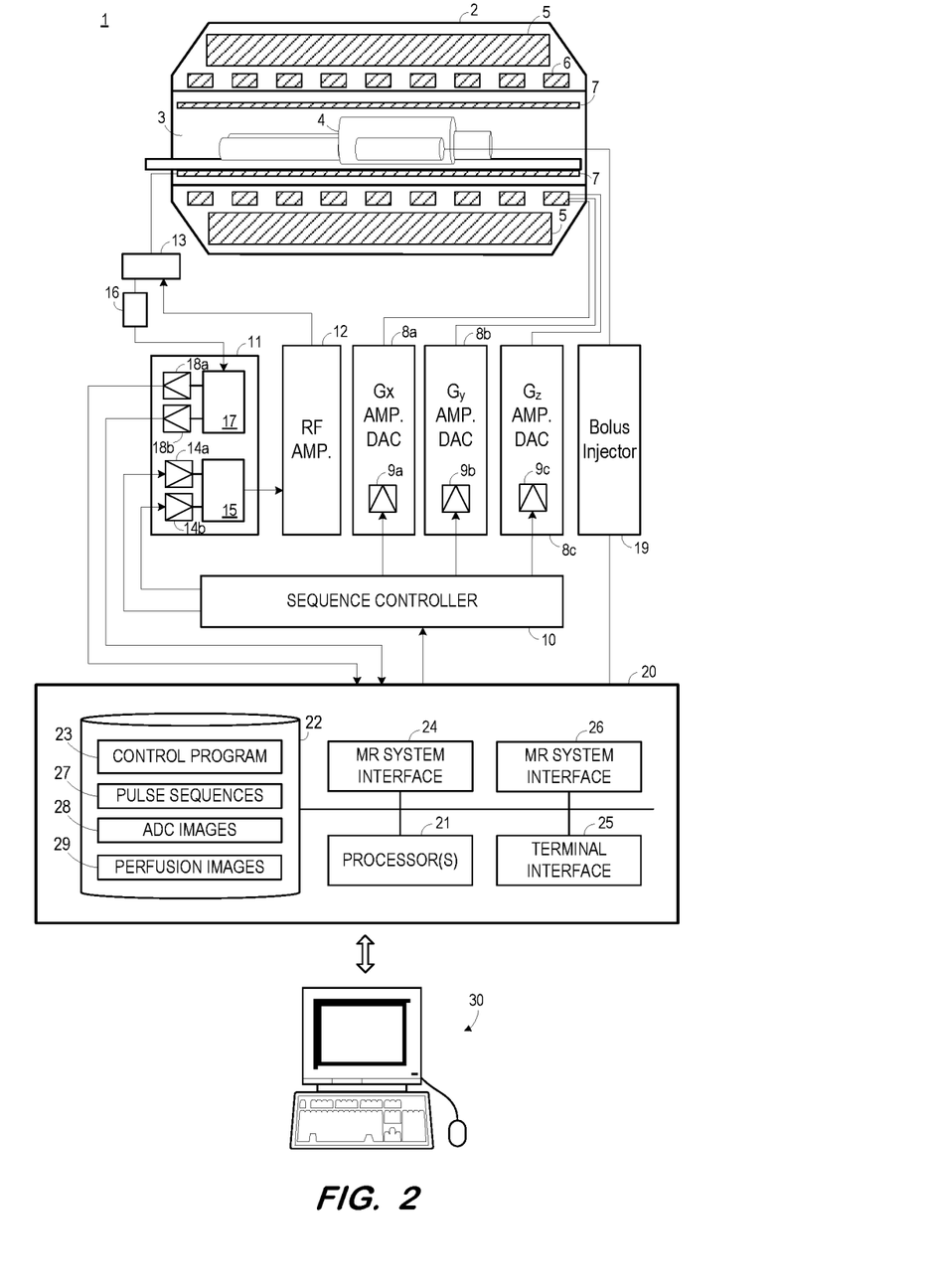
FIG. 2 is a block diagram of an MR system according to some embodiments.

Pulse sequence 100 may be executed by an MR system as is known in the art. FIG. 2 illustrates MR system 1 for executing pulse sequence 100 according to some embodiments. Embodiments are not limited to MR system 1.

MR system 1 includes MR chassis 2, which defines bore 3 in which patient 4 is disposed. MR chassis 2 includes polarizing main magnet 5, gradient coils 6 and RF coil 7 arranged about bore 3. According to some embodiments, polarizing main magnet 5 generates a uniform main magnetic field ($B_0$) and RF coil 7 emits an excitation field ($B_1$).

According to MR techniques, a volume of material (e.g., human tissue) is subjected to a main polarizing magnetic field (i.e., $B_0$), causing the individual magnetic moments of the nuclear spins in the substance to process about the polarizing field in random order at their characteristic Larmor frequency, in an attempt to align with the field. A net magnetic moment $M_z$ is produced in the direction of the polarizing field, and the randomly oriented magnetic components in the perpendicular plane (the x-y plane) cancel out one another.

The material is then subjected to an excitation field (i.e., $B_1$) created by emission of a radiofrequency (RF) pulse, which is in the x-y plane and near the Larmor frequency, causing the net aligned magnetic moment $M_z$ to rotate into the x-y plane so as to produce a net transverse magnetic moment $M_t$, which is rotating, or spinning, in the x-y plane at the Larmor frequency. The excitation field is terminated, and signals are emitted by the excited spins as they return to their pre-excitation field state. The emitted signals are detected, digitized and processed to reconstruct an image using one of many well-known MR reconstruction techniques.

Gradient coils 6 produce magnetic field gradients $G_x$, $G_y$, and $G_z$ which are used for position-encoding NMR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 6 may consist of three windings, for example, each of which is supplied with current by an amplifier 8a-8c in order to generate a linear gradient field in its respective Cartesian direction (i.e., x, y, or z). Each amplifier 8a-8c includes a digital-analog converter 9a-9c which is controlled by a sequence controller 10 to generate desired gradient pulses at proper times.

Sequence controller 10 also controls the generation of RF pulses by RF system 11 and RF power amplifier 12. RF system 11 and RF power amplifier 12 are responsive to a scan prescription and direction from sequence controller 10 to produce RF pulses of the desired frequency, phase, and pulse amplitude waveform. The generated RF pulses may be applied to the whole of RF coil 7 or to one or more local coils or coil arrays. RF coil 7 converts the RF pulses emitted by RF power amplifier 12, via multiplexer 13, into a magnetic alternating field in order to excite the nuclei and align the nuclear spins of the object to be examined or the region of the object to be examined. As mentioned above, RF pulses may be emitted in a magnetization preparation step in order to enhance or suppress certain signals.

The RF pulses are represented digitally as complex numbers. Sequence controller 10 supplies these numbers in real and imaginary parts to digital-analog converters 14a-14b in RF system 11 to create corresponding analog pulse sequences. Transmission channel 15 modulates the pulse sequences with a radio-frequency carrier signal having a base frequency corresponding to the resonance frequency of the nuclear spins in the volume to be imaged.

RF coil 7 both emits radio-frequency pulses as described above and scans the alternating field which is produced as a result of precessing nuclear spins, i.e. the nuclear spin echo signals. The received signals are received by multiplexer 13, amplified by RF amplifier 16 and demodulated in receiving channel 17 of RF system 11 in a phase-sensitive manner. Analog-digital converters 18a and 18b convert the demodulated signals into real and imaginary components.

Computing system 20 receives the real and imaginary components from analog-digital converters 18a and 18b and reconstructs an image therefrom according to known techniques. System 20 may comprise any general-purpose or dedicated computing system. Accordingly, system 20 includes one or more processing units 21 (e.g., processors, processor cores, execution threads, etc.) configured to execute processor-executable program code to cause system 20 to operate as described herein, and storage device 22 for storing the program code. Storage device 22 may comprise one or more fixed disks, solid-state random-access memory, and/or removable media (e.g., a thumb drive) mounted in a corresponding interface (e.g., a USB port).

Storage device 22 stores program code of control program 23. One or more processing units 21 may execute control program 23 to provide instructions to sequence controller 10 via MR system interface 24. For example, sequence controller 10 may be instructed to initiate a desired pulse sequence of pulse sequences 27. Pulse sequences 27 may include pulse sequences for acquiring perfusion data and diffusion data as described herein. Sequence controller 10 may be instructed to control the switching of magnetic field gradients via amplifiers 8a-8c at appropriate times, the transmission of radio-frequency pulses having a specified phase and amplitude at specified times via RF system 11 and RF amplifier 12, and the readout of the resulting MR signals.

Control program 23 may also be executed to control injector interface 26 as required by various pulse sequences of pulse sequences 27. In response, injector interface 26 controls media injector 19 to inject contrast media into patient 4 as is known in the art. For example, media injector 19 may be controlled to inject a designated amount of media into patient 4 at a designated rate and at a designated time prior to execution of a pulse sequence for acquiring perfusion data.

Control program 23 may further be executed to generate diffusion images 28 based on diffusion data acquired as described herein, and to generate perfusion images 29 based on perfusion data acquired as described herein. Diffusion images 28 may comprise apparent diffusion coefficient (ADC) images or conventional diffusion images.

Diffusion images 28 and/or perfusion images 29 may be provided to terminal 30 via terminal interface 25 of system 20. Terminal interface 25 may also receive input from terminal 30, which may be used to provide commands to control program 23 in order to control sequence controller 10 and/or other elements of system 1. The commands may include commands to initiate an imaging sequence to acquire image data of a subject. Terminal 30 may simply comprise a display device and an input device coupled to system 20. In some embodiments, terminal 30 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 22 may also store data and other program code for providing additional functionality and/or which are necessary for operation of system 20, such as device drivers, operating system files, etc.

Figure 3:
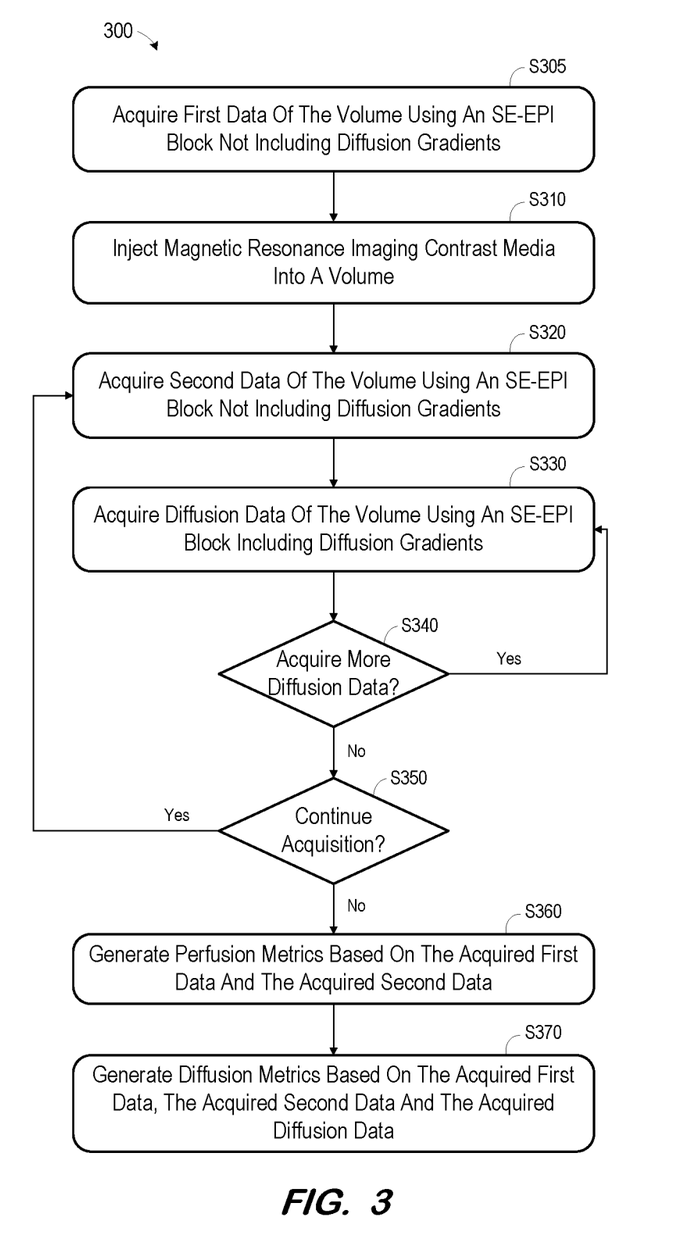
FIG. 3 comprises a flow diagram of a process to generate perfusion and diffusion metrics using an interleaved pulse sequence according to some embodiments.

FIG. 3 comprises a flow diagram of process 300 to generate a perfusion image and a diffusion image using an interleaved pulse sequence according to some embodiments. In some embodiments, various hardware elements of system 1 (e.g., one or more processors) execute program code to perform process 300. The steps of process 300 need not be performed by a single device or system, nor temporally adjacent to one another.

Process 300 and all other processes mentioned herein may be embodied in processor-executable program code read from one or more of non-transitory computer-readable media, such as a disk-based or solid-state hard drive, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Initially, at S305, first data is acquired from a volume using an SE-EPI block which does not include diffusion gradients. The first data may be considered baseline data. Because the first data is acquired without diffusion gradients, the first data is usable as perfusion data and B0 diffusion data as described above.

Next, at S310, MR contrast media is injected into the volume. According to one non-exhaustive example, S310 includes controlling injector 19 to inject a bolus of paramagnetic gadolinium into the blood vessels of patient 4.

Next, at S320, second data is acquired from the volume using an SE-EPI block which does not include diffusion gradients. The block may be initiated at S320 at a prespecified time after injection of the contrast media at S310. The predetermined time may be determined so as to allow the contrast media to flow to an area to be imaged.

Figure 4:
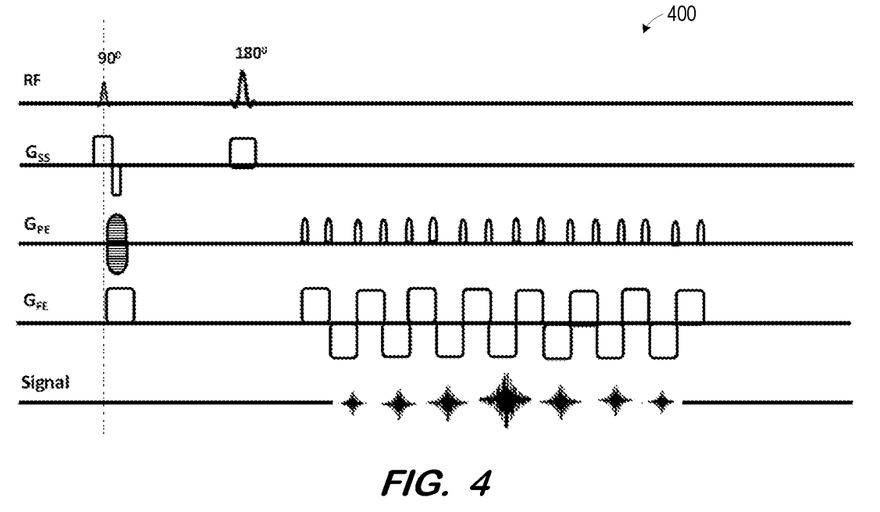
FIG. 4 illustrates signals of an EPI sequence to acquire first data according to some embodiments.

FIG. 4 illustrates signals of an SE-EPI block to acquire second data according to some embodiments of S320. Block 400 represents a standard SE-EPI sequence including a pair of 90°-180° RF excitation pulses which apply T2 weighting as is known in the art. A slice selection gradient ($G_{SS}$) is used to select the volume of interest. Within the volume of interest, the position of each point will be encoded vertically and horizontally by the phase encoding gradient ($G_{PE}$), and the frequency-encoding gradient ($G_{FE}$). The acquired Signal (i.e., data) is in the form of a gradient echo train, to acquire total k-space (for a single-shot acquisition) or partial k-space (for a segmented acquisition). As described above, the k-space data acquired at S320 using no diffusion gradients may be considered perfusion data and B0 diffusion gradient data.

Figure 5:
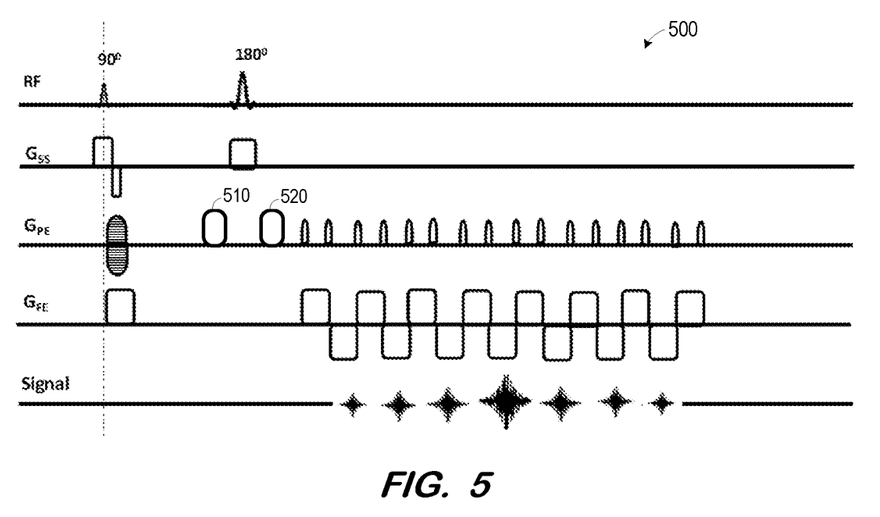
FIG. 5 illustrates signals of an EPI sequence to acquire diffusion data according to some embodiments.

Diffusion data is then acquired at S330. The diffusion data is acquired at S330 using an SE-EPI block which includes diffusion gradients. FIG. 5 illustrates signals of an SE-EPI block to acquire diffusion data at S330 according to some embodiments. Block 500 is identical to sequence 400 except for diffusion gradients 510 and 520 of phase encoding gradient signal $G_{PE}$. As is known in the art, diffusion gradients 510 and 520 are associated with a direction and a strength. Accordingly, the Signal (i.e., data) acquired using block 500 may be considered diffusion data associated with the direction and strength of diffusion gradients 510 and 520.

Next, at S340, is it determined whether more diffusion data is to be acquired within the present imaging sequence. The determination at S340 is a function of programming of the sequence. That is, flow returns to S330 to acquire more diffusion data if the sequence is programmed to do so. As described above, S330 may be executed several consecutive times, using different diffusion gradients, in order to acquire different diffusion data. Some common clinical embodiments require three diffusion strengths and at least three diffusion directions. Embodiments are not limited to three diffusion strengths or to three different diffusion directions.

Accordingly, in the present example, flow returns to S330 to execute another SE-EPI block including diffusion gradients and directions in order to acquire a second set of diffusion data. The diffusion gradients and directions may differ from those used in the first iteration of S330. Flow then cycles between S340 and S330 once more to execute another SE-EPI block including respective diffusion gradients and directions. At this point of process 300, three set of diffusion data have been acquired at S330 and one set of perfusion/diffusion data has been acquired at S320.

Figure 6:
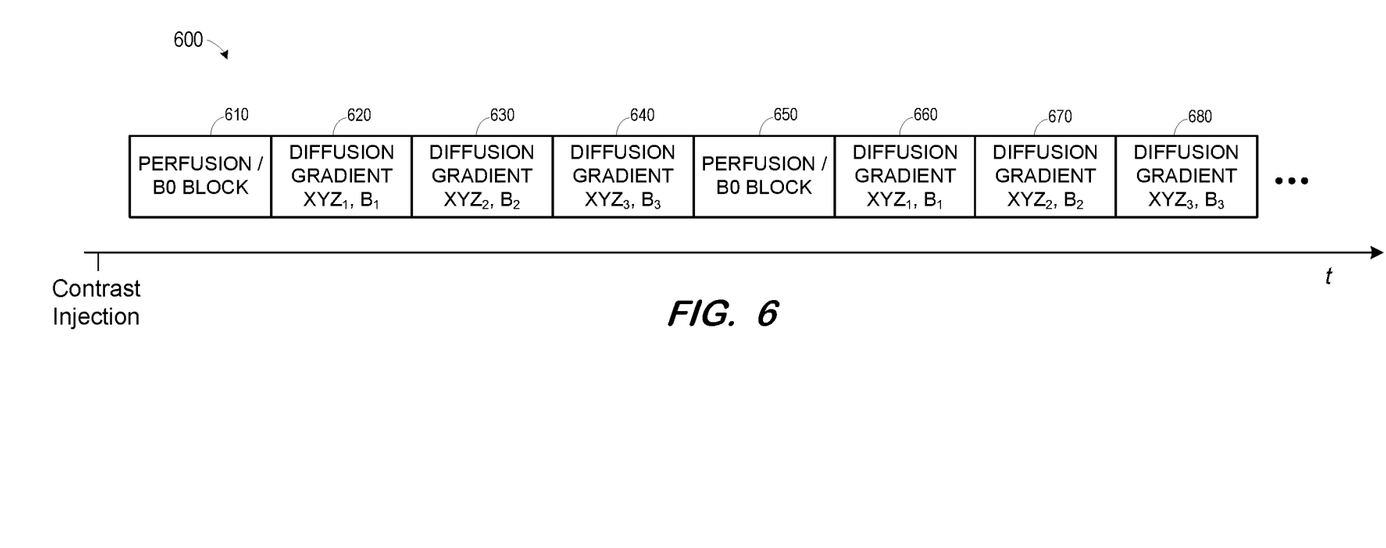
FIG. 6 illustrates a pulse sequence according to some embodiments.

FIG. 6 illustrates a pulse sequence 600 according to some embodiments and as described above. Pulse sequence 600 includes perfusion/diffusion block 610 to execute at S320 as described above, followed by three diffusion blocks 620, 630 and 640. Each of diffusion blocks 620, 630 and 640 exhibits a different diffusion gradient direction ($XYZ_n$) and strength ($B_n$).

Returning to process 300, flow proceeds to S350 if it is determined at S340 that no more diffusion data is to be acquired in the diffusion portion of the sequence. At S350, it is determined whether to acquire more k-space data. Considering perfusion/diffusion block 610 and diffusion blocks 620, 630 and 640 as comprising a single sub-sequence, the full sequence may be programmed to include a number of sub-sequences which corresponds to the period of time during which contrast media is expected to remain in the volume of interest. For example, if execution of a sub-sequence takes 2 s, and the contrast media washes out 10 s after injection, sequence 600 may be programmed to include five sub-sequences. Accordingly, flow returns to S320 from S350 if all programmed sub-sequences have not yet been executed.

Continuing the example of FIG. 6, perfusion/diffusion block 650 and diffusion blocks 660, 670 and 680 may then be executed. Each of diffusion blocks 650, 660 and 670 exhibits a same diffusion gradient direction ($XYZ_n$) and strength ($B_n$) as a corresponding one of diffusion blocks 620, 630 and 640. More specifically, block 650 may be identical to block 620, block 660 may be identical to block 630, and block 670 may be identical to block 64. Subsequent sub-sequences (not shown) may follow a same pattern.

Flow continues from S350 to S360 after all sub-sequences have been executed. At S360, perfusion metrics are generated as is known in the art based on the first data acquired at S305 and on all of the second data acquired during all iterations of S320. Diffusion metrics are generated at S370 based on the first data acquired at S305 (i.e., baseline B0 data), the data acquired during all iterations of S320 (i.e., the post-contrast B0 data) and the data acquired during all iterations of S330. The perfusion and diffusion metrics may be stored, displayed as images, and/or reviewed by clinicians.

Sequence 600 includes repeating identical sub-sequences. Such a sequence may result in diffusion images and perfusion images which facilitate study of the relationship between perfusion and diffusion. Embodiments are not limited to the use of identical diffusion blocks in successive sub-sequences. For example, any of the diffusion blocks executed during process 300 may include diffusion gradients having any combination of direction and strength.

Figure 7:
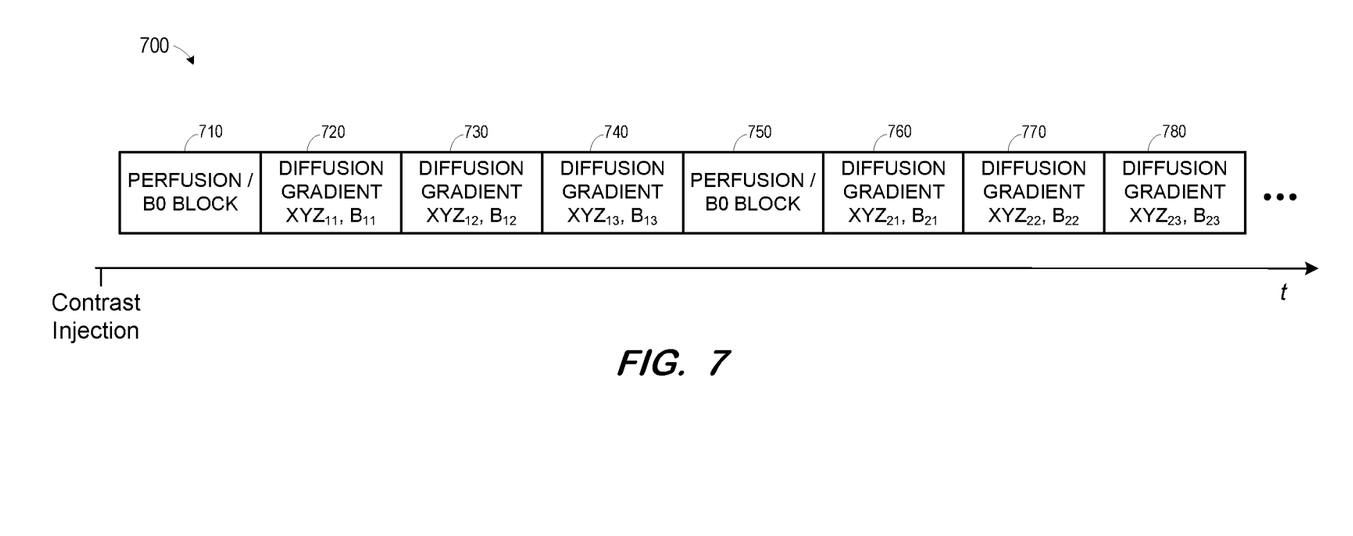
FIG. 7 illustrates a pulse sequence according to some embodiments.

FIG. 7 illustrates sequence 700 in which perfusion/diffusion block 710 and diffusion blocks 720, 730 and 740 comprise a first sub-sequence and perfusion/diffusion block 750 and diffusion blocks 760, 770 and 780 comprise a second sub-sequence. According to the illustrated example, each of diffusion blocks 720, 730, 740, 760, 770 and 780 exhibits a different diffusion gradient direction ($XYZ_{sn}$) and strength ($B_{sn}$). The acquisition of diffusion data using such an implementation may provide improved temporal sampling of the gradients and greater signal-to-noise ratio as compared to sequence 600 and may therefore be better suited for clinical studies.

In some embodiments, and as described above with respect to FIG. 1, each sub-sequence may include a single perfusion/B0 block and a single diffusion block. The single diffusion block of each sub-sequence may exhibit a different diffusion gradient direction. For example, the diffusion blocks of three consecutive sub-sequences may each use a different diffusion gradient direction, such that execution of the sub-sequences results in acquisition of sufficient data to generate diffusion metrics.

Figure 8:
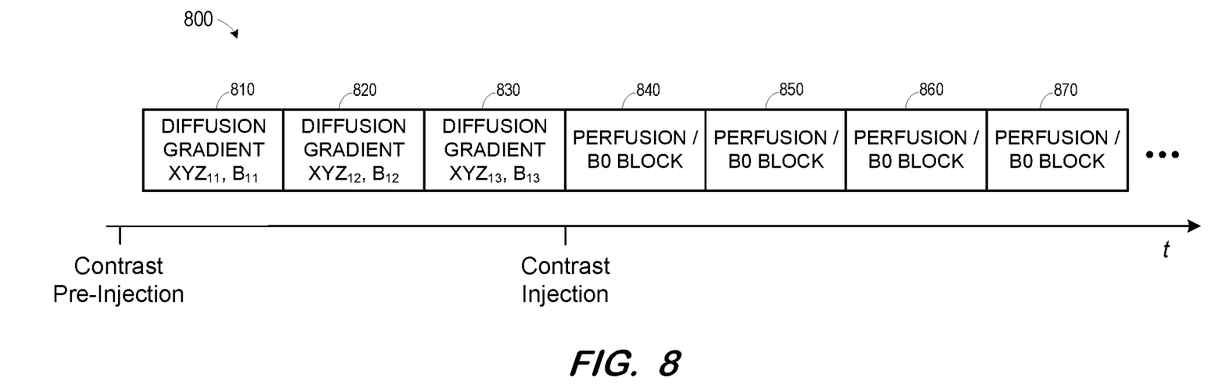
FIG. 8 illustrates a pulse sequence according to some embodiments.

FIG. 8 illustrates sequence 800 according to yet another embodiment. Sequence 800 includes diffusion blocks 810 through 830 which are executed to acquire diffusion data after a contrast pre-injection and before contrast injection as described above. For example, the contrast pre-injection may comprise 10% of a typical injected contrast volume. Passage of the small bolus of the contrast pre-injection through the tissue will de-phase the intravascular water spins. This phenomenon may reduce error in cellularity estimates based on diffusion images generated from diffusion data acquired during the passage.

Embodiments are not limited to the execution of three diffusion blocks after the contrast pre-injection. Moreover, the three diffusion blocks may include diffusion gradients of any suitable directions and strengths. Any of the diffusion blocks executed prior to the contrast injection may comprise a B0 block (i.e., an SE-EPI sequence without diffusion gradients). According to some embodiments, diffusion blocks are executed for 60 s after the contrast pre-injection, after which contrast is injected for subsequent perfusion data acquisition.

In this regard, blocks 840 through 870 of sequence 800 are executed after full contrast injection and comprise SE-EPI sequences without diffusion gradients. As described above, tracer dilution theory assumes a non-diffusible tracer. The pre-injection may serve to saturate the volume such that the diffusivity of the subsequently injected contrast within the volume is closer to the assumed ideal. Accordingly, perfusion images generated based on perfusion data acquired by blocks 840 through 870 may more accurately represent perfusion. Data acquired using these blocks may also be combined with the previously acquired diffusion data as described above to generate diffusion images. According to some embodiments, sequence 800 also includes diffusion blocks for acquiring diffusion data after the acquisition of the perfusion data.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of a system according to some embodiments may include a processor to execute program code such that the computing device operates as described herein.

Embodiments described herein are solely for the purpose of illustration. Those in the art will recognize other embodiments may be practiced with modifications and alterations to that described above.

What is claimed is:

1. A system comprising:
a chassis defining a bore;
a main magnet to generate a polarizing magnetic field within the bore;
a gradient system to apply a gradient magnetic field to the polarizing magnetic field;
a radio frequency system to transmit radio frequency pulses to a volume disposed within the bore and to receive signals from the volume; and
a computing system to execute program code to:
execute a first magnetic resonance imaging pulse sequence comprising:
a first block to acquire first data of the volume using a first spin-echo echo planar imaging pulse sequence;
a second block to acquire first diffusion data of the volume using a second spin-echo echo planar imaging pulse sequence comprising a first one or more diffusion gradient pulses;
a third block to acquire second diffusion data of the volume using a third spin-echo echo planar imaging pulse sequence comprising a second one or more diffusion gradient pulses; and
a fourth block to acquire third diffusion data of the volume using a fourth spin-echo echo planar imaging pulse sequence comprising a third one or more diffusion gradient pulses;
generate perfusion metrics based on the first data; and
generate diffusion metrics based on the first data, the first diffusion data, the second diffusion data, and the third diffusion data.

2. A system according to claim 1, the first magnetic resonance imaging pulse sequence comprising:
a fifth block to acquire second data of the volume using a fifth spin-echo echo planar imaging pulse sequence;
a sixth block to acquire fourth diffusion data of the volume using a sixth spin-echo echo planar imaging pulse sequence comprising a fourth one or more diffusion gradient pulses;
a seventh block to acquire fifth diffusion data of the volume using a seventh spin-echo echo planar imaging pulse sequence comprising a fifth one or more diffusion gradient pulses; and
an eighth block to acquire sixth diffusion data of the volume using an eighth spin-echo echo planar imaging pulse sequence comprising a sixth one or more diffusion gradient pulses, wherein the perfusion metrics are generated based on the first data and the second data, and
wherein the diffusion metrics are generated based on the first data, the second data, the first diffusion data, the second diffusion data, the third diffusion data, the fourth diffusion data, the fifth diffusion data, and the sixth diffusion data.

3. A system according to claim 2, wherein the first one or more diffusion gradient pulses are similar to the fourth one or more diffusion gradient pulses, the second one or more diffusion gradient pulses are similar to the fifth one or more diffusion gradient pulses, and the third one or more diffusion gradient pulses are similar to the sixth one or more diffusion gradient pulses.

4. A system according to claim 2, wherein each of the first one or more diffusion gradient pulses, the second one or more diffusion gradient pulses, the third one or more diffusion gradient pulses, the fourth one or more diffusion gradient pulses, the fifth one or more diffusion gradient pulses, and the sixth one or more diffusion gradient pulses are each associated with different gradient directions.

5. A system according to claim 4, wherein each of the first one or more diffusion gradient pulses, the second one or more diffusion gradient pulses, the third one or more diffusion gradient pulses, the fourth one or more diffusion gradient pulses, the fifth one or more diffusion gradient pulses, and the sixth one or more diffusion gradient pulses are each associated with different gradient strengths.

6. A system according to claim 1, further comprising a contrast media injector to inject a first amount of contrast media into the volume and to inject a second amount of contrast media into the volume, the second amount being at least five times greater than the first amount,
wherein the second block, the third block and the fourth block are executed after injection of the first amount of contrast media and before the injection of the second amount of contrast media, and
wherein the first block is executed after the injection of the second amount of contrast media.

7. A system according to claim 6, the first magnetic resonance imaging pulse sequence comprising a fifth block to acquire second data of the volume using a fifth spin-echo echo planar imaging pulse sequence,
wherein the perfusion metrics are generated based on the first data and the second data, and
wherein the diffusion metrics are generated based on the first data, the second data, the first diffusion data, the second diffusion data, and the third diffusion data.

8. A method for executing a magnetic resonance imaging pulse sequence comprising:
executing a first spin-echo echo planar imaging pulse sequence to acquire first data of a volume;
executing a second spin-echo echo planar imaging pulse sequence comprising a first one or more diffusion gradient pulses to acquire first diffusion data of the volume;
executing a third spin-echo echo planar imaging pulse sequence comprising a second one or more diffusion gradient pulses to acquire second diffusion data of the volume; and
executing a fourth spin-echo echo planar imaging pulse sequence comprising a third one or more diffusion gradient pulses to acquire third diffusion data of the volume;
generating perfusion metrics based on the first data; and generating diffusion metrics based on the first data, the first diffusion data, the second diffusion data, and the third diffusion data.

9. A method for executing a magnetic resonance imaging pulse sequence according to claim 8, further comprising:
executing a fifth spin-echo echo planar imaging pulse sequence to acquire second data of the volume;
executing a sixth spin-echo echo planar imaging pulse sequence comprising a fourth one or more diffusion gradient pulses to acquire fourth diffusion data of the volume;
executing a seventh spin-echo echo planar imaging pulse sequence comprising a fifth one or more diffusion gradient pulse to acquire fifth diffusion data of the volume; and
executing an eighth spin-echo echo planar imaging pulse sequence comprising a sixth one or more diffusion gradient pulses to acquire sixth diffusion data of the volume,
wherein the perfusion metrics are generated based on the first data and the second data, and
wherein the diffusion metrics are generated on the first data, the second data, the first diffusion data, the second diffusion data, the third diffusion data, the fourth diffusion data, the fifth diffusion data, and the sixth diffusion data.

10. A method according to claim 9, wherein the first one or more diffusion gradient pulses are similar to the fourth one or more diffusion gradient pulses, the second one or more diffusion gradient pulses are similar to the fifth one or more diffusion gradient pulses, and the third one or more diffusion gradient pulses are similar to the sixth one or more diffusion gradient pulses.

11. A method according to claim 9, wherein each of the first one or more diffusion gradient pulses, the second one or more diffusion gradient pulses, the third one or more diffusion gradient pulses, the fourth one or more diffusion gradient pulses, the fifth one or more diffusion gradient pulses, and the sixth one or more diffusion gradient pulses are each associated with different gradient directions.

12. A method according to claim 11, wherein each of the first one or more diffusion gradient pulses, the second one or more diffusion gradient pulses, the third one or more diffusion gradient pulses, the fourth one or more diffusion gradient pulses, the fifth one or more diffusion gradient pulses, and the sixth one or more diffusion gradient pulses are each associated with different gradient strengths.

13. A method for executing a magnetic resonance imaging pulse sequence according to claim 8, further comprising:
injecting a first amount of contrast media into the volume;
injecting a second amount of contrast media into the volume, the second amount being at least five times greater than the first amount,
wherein the second spin-echo echo planar imaging pulse sequence, the third spin-echo echo planar imaging pulse sequence and the fourth spin-echo echo planar imaging pulse sequence are executed after injection of the first amount of contrast media and before the injection of the second amount of contrast media, and
wherein the first spin-echo echo planar imaging pulse sequence is executed after the injection of the second amount of contrast media.

14. A method for executing a magnetic resonance imaging pulse sequence according to claim 13, further comprising:
executing a fifth spin-echo echo planar imaging pulse sequence to acquire second data of the volume,
wherein the perfusion image is generated based on the first data and the second data, and
wherein the diffusion metrics are generated based on the first data, the second data, the first diffusion data, the second diffusion data, and the third diffusion data.

15. A computing system comprising:
a memory storing processor-executable program code; and
one or more processors to execute the program code to:
execute a first spin-echo echo planar imaging pulse sequence block of a magnetic resonance imaging pulse sequence to acquire first data of a volume;
execute a second spin-echo echo planar imaging pulse sequence block of the magnetic resonance imaging pulse sequence comprising a first one or more diffusion gradient pulses to acquire first diffusion data of the volume;
execute a third spin-echo echo planar imaging pulse sequence block of the magnetic resonance imaging pulse sequence comprising a second one or more diffusion gradient pulses to acquire second diffusion data of the volume; and
execute a fourth spin-echo echo planar imaging pulse sequence block of the magnetic resonance imaging pulse sequence comprising a third one or more diffusion gradient pulses to acquire third diffusion data of the volume;
generate perfusion metrics based on the first data; and
generate diffusion metrics based on the first data, the first diffusion data, the second diffusion data, and the third diffusion data.

16. A system according to claim 15, the one or more processors to execute the program code to:
execute a fifth spin-echo echo planar imaging pulse sequence block of the magnetic resonance imaging pulse sequence to acquire second data of the volume;
execute a sixth spin-echo echo planar imaging pulse sequence block of the magnetic resonance imaging pulse sequence comprising a fourth one or more diffusion gradient pulses to acquire fourth diffusion data of the volume;
execute a seventh spin-echo echo planar imaging pulse sequence block of the magnetic resonance imaging pulse sequence comprising a fifth one or more diffusion gradient pulse to acquire fifth diffusion data of the volume; and
execute an eighth spin-echo echo planar imaging pulse sequence block of the magnetic resonance imaging pulse sequence comprising a sixth one or more diffusion gradient pulses to acquire sixth diffusion data of the volume,
wherein the perfusion metrics are generated based on the first data and the second data, and
wherein the diffusion metrics are generated based on the first data, the second data, the first diffusion data, the second diffusion data, the third diffusion data, the fourth diffusion data, the fifth diffusion data, and the sixth diffusion data.

17. A system according to claim 16, wherein the first one or more diffusion gradient pulses are similar to the fourth one or more diffusion gradient pulses, the second one or more diffusion gradient pulses are similar to the fifth one or more diffusion gradient pulses, and the third one or more diffusion gradient pulses are similar to the sixth one or more diffusion gradient pulses.

18. A system according to claim 16, wherein each of the first one or more diffusion gradient pulses, the second one or more diffusion gradient pulses, the third one or more diffusion gradient pulses, the fourth one or more diffusion gradient pulses, the fifth one or more diffusion gradient pulses, and the sixth one or more diffusion gradient pulses are each associated with different gradient directions.

19. A system according to claim 15, the one or more processors to execute the program code to:
  inject a first amount of contrast media into the volume;
  inject a second amount of contrast media into the volume, the second amount being at least five times greater than the first amount,
  wherein the second spin-echo echo planar imaging pulse sequence, the third spin-echo echo planar imaging pulse sequence and the fourth spin-echo echo planar imaging pulse sequence are executed after injection of the first amount of contrast media and before the injection of the second amount of contrast media, and
  wherein the first spin-echo echo planar imaging pulse sequence is executed after the injection of the second amount of contrast media.

20. A system according to claim 19, the one or more processors to execute the program code to:
  execute a fifth spin-echo echo planar imaging pulse sequence block of the magnetic resonance imaging pulse sequence to acquire second data of the volume,
  wherein the perfusion metrics are generated based on the first data and the second data, and
  wherein the diffusion metrics are generated based on the first data, the second data, the first diffusion data, the second diffusion data, and the third diffusion data.

* * * * *